United States Patent
Shirley et al.

(10) Patent No.: US 7,760,532 B2
(45) Date of Patent: *Jul. 20, 2010

(54) MULTI-BANK MEMORY

(75) Inventors: Brian M. Shirley, Boise, ID (US);
David R. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/861,959

(22) Filed: Sep. 26, 2007

(65) Prior Publication Data

US 2008/0013356 A1 Jan. 17, 2008

Related U.S. Application Data

(63) Continuation of application No. 11/379,194, filed on Apr. 18, 2006, now Pat. No. 7,292,497, which is a continuation of application No. 09/809,586, filed on Mar. 15, 2001, now Pat. No. 7,088,604.

(51) Int. Cl.
*G11C 5/02* (2006.01)
*G11C 7/00* (2006.01)
*G11C 8/00* (2006.01)

(52) U.S. Cl. .......................... 365/51; 365/63; 365/205; 365/207; 365/208; 365/230.03; 365/230.06; 365/185.11

(58) Field of Classification Search ................... 365/51, 365/63, 205, 207, 208, 230.03, 230.06, 185.11
See application file for complete search history.

(56) References Cited

U.S. PATENT DOCUMENTS

| | | | |
|---|---|---|---|
| 5,159,572 A | 10/1992 | Morton | |
| 5,274,788 A | 12/1993 | Koike | |
| 5,642,323 A | 6/1997 | Kotani et al. | |
| 5,970,016 A | 10/1999 | Ohsawa | |
| 5,973,991 A | 10/1999 | Tsuchida et al. | |
| 6,067,270 A | 5/2000 | Hwang | |
| 6,097,660 A | 8/2000 | Tsuchida et al. | |
| 6,134,172 A | 10/2000 | Barth et al. | |
| 6,166,986 A | 12/2000 | Kim | |
| 6,310,814 B1 | 10/2001 | Hampel et al. | |
| 6,310,817 B1 | 10/2001 | Kablanian | |
| 6,335,875 B2 | 1/2002 | Ooishi | |
| 6,418,077 B1 | 7/2002 | Naven | |
| 6,731,527 B2 * | 5/2004 | Brown ................... 365/230.03 | |
| 7,088,604 B2 | 8/2006 | Shirley et al. | |
| 2006/0193190 A1 | 8/2006 | Shirley et al. | |

OTHER PUBLICATIONS

"Rambus Direct RDRAM 128/144-Mbit (256kx16/18x32s) Preliminary Information", Document DL0059, V1.11,(Jun. 2000),pp. 1-66.
"Rambus Direct RDRAM 256/288-Mbit (1Mx16/18x16d) Preliminary Information", Document DL 0105, V1.1,(Aug. 2000),pp. 1-72.

* cited by examiner

*Primary Examiner*—Trong Phan
(74) *Attorney, Agent, or Firm*—Schwegman, Lundberg, & Woessner, P.A.

(57) ABSTRACT

A multi-bank memory device includes rows and columns of memory cores. Each row includes memory cores from one bank interleaved with memory cores from another bank. Banks in different rows can be simultaneously accessed.

25 Claims, 5 Drawing Sheets

MULTI-BANK MEMORY

CROSS REFERENCES TO RELATED APPLICATIONS

This application is a Continuation of U.S. application Ser. No. 11/379,194, filed on Apr. 18, 2006, now issued as U.S. Pat. No. 7,292,497, which is a Continuation of U.S. application Ser. No. 09/809,586, filed on Mar. 15, 2001, now issued as U.S. Pat. No. 7,088,604; the specifications of which are hereby incorporated by reference.

TECHNICAL FIELD OF THE INVENTION

The present invention relates generally to memory devices, and in particular, the present invention relates to memory devices having multiple banks.

BACKGROUND OF THE INVENTION

Direct Rambus Dynamic Random Access Memories, hereinafter referred to as DRDRAMs, are very fast, highly pipelined memory devices that are becoming an industry standard in high speed processing systems. DRDRAMs include a considerable amount of internal circuitry that supports the pipelined architecture so as to provide for very high communication bandwidths at the device boundary. DRDRAM sustained data transfer rates exceed 1 GB/s.

DRDRAMs, like most commercially available memories, include memory cells that are arranged in rows and columns. Unlike many commercially available memories, however, DRDRAMs are multi-bank devices that have memory cells logically arranged into banks that can be independently accessed. This results in multiple banks within each DRDRAM, each including a number of memory cells. Gathering the memory cells into banks, and allowing different banks to undergo separate operations simultaneously, increases the overall data transfer rate of the device.

Each bank is associated with one or more sense amplifiers that function to read data from, and write data to, the memory cells within the bank. The sense amplifiers serve as a data communications bridge between the banks of memory cells and the data buses external to the device. Banks are separately activated, possibly simultaneously, or overlapping in time, prior to a read or write operation. When a bank is activated, it communicates with one or more sense amplifiers. When the read or write operation is complete, the bank is deactivated, and the sense amplifiers are precharged, which readies the sense amplifiers for another operation.

Examples of DRDRAMs are described in: "Rambus Direct RDRAM 128/144-Mbit (256kx16/18x32s) Preliminary Information," Document DL0059, V1.11, June 2000;; and "Rambus Direct RDRAM 256/288-Mbit (1Mx16/18x16d) Preliminary Information," Document DL0105, V1.1, August 2000. The contents of the aforementioned documents are hereby incorporated by reference.

FIG. 1 shows a prior art multi-bank memory device. Memory device 100 includes memory cells arranged in rows and columns. Each column is shown as a vertical strip of memory cells, and each row is shown as a horizontal strip of memory cells. For example, strip 102 is a column that includes memory cells 120, 124, and 128, and strip 104 is a column that includes memory cells 130, 134, and 138. In memory device 100, each column corresponds to a single bank of memory cores. For example, memory cores 120, 124, and 128 of strip 102 are part of Bank 0, and memory cores 130, 134, and 136 of strip 104 are part of Bank 1. In similar fashion, strips 106 and 108 contain similar memory cells, such as 131, to form bank 2 and bank n-1 respectively. As shown in FIG. 1, memory device 100 is arranged into "n" banks labeled Bank 0 through Bank (n-1).

Each bank shares sense amplifiers with at least one other bank. For example, sense amplifiers 140, 142, and 144 are shared between memory cores in Bank 0 and memory cores in Bank 1, and sense amplifiers 146, 148, and 150 are shared between memory cores in Bank 1 and memory cores in Bank 2.

Local row decoders are arranged within the array of memory cores. Each local row decoder provides wordline addressing to memory cores in close proximity. For example, in FIG. 1, each of row decoders 122 and 126 provide row decoding for one or more of the memory cores in strip 102. Similarly, row decoders 132 and 163 provide row decoding for one or more of the memory cores in strip 104.

Column decoding, in contrast to row decoding, is performed globally. Column decode lines driven by column decoders typically traverse an entire row of memory cores, rather than only memory cores nearby. For example, column decoder 110 drives column decode lines 160 shown schematically in FIG. 1 as an arrow. One or more of column decode lines 160 traverse multiple memory cells of the row to enable sense amplifiers within the row across from the column decoder. For example, a column decode line that enables sense amplifiers 146 to read from memory core 131 in Bank 2 will typically travel over, under, or past memory cores 120 and 130 from Banks 0 and 1, respectively.

In memory devices that allow simultaneous access to multiple banks, such as DRDRAMs, column decode lines that traverse memory cores from multiple banks can be problematic, in part because column decode lines addressed to one bank can cause electrical noise in memory cores of other banks being accessed. If noise is great enough, data errors can result.

FIG. 2 shows a prior art sense amplifier suitable for use in a multi-bank memory. Sense amplifier 200 includes N-sense amplifier 202 and P-sense amplifier 204 coupled between sense nodes 232 and 234, isolation transistors 206A, 206B, 208A, and 208B, column decode transistors 210 and 212, and bank select transistors 216 and 218. Sense nodes 232 and 234 are coupled to input output (I/O) lines 224 and 222 through the column decode and bank select transistors. A column decode signal (Y-GATE) on node 214 is coupled to column decode transistors 210 and 212, and a bank select signal (BANK) on node 220 is coupled to bank select transistors 216 and 218. Other column decode lines 230 driven by the column decoder 110 (FIG. 1) pass nearby sense amplifier 200. Other column decode lines 230 are coupled to other sense amplifiers (not shown) in the same manner that Y-GATE is coupled to sense amplifier 200 on node 214.

The operation of sense amplifier 200 is well known. When data from a memory core either to the left or right of sense amplifier 200 is to be read, the appropriate isolation transistors are turned on by either signal ISOL or ISOR, and the N-sense and P-sense amplifiers are activated using signals NLAT and ACT, respectively. The data value (and its complement) being read appears on sense nodes 232 and 234. When both the column decode signal (Y-GATE) on node 214 and the bank select signal (BANK) on node 220 are asserted, transistors 210, 212, 216, and 218 turn on and couple sense amplifier 200 to I/O lines 222 and 224.

When sense amplifier 200 is used in a multi-bank memory device that allows simultaneous operations among banks, the other column decode lines 230 can be actively changing during the operation of sense amplifier 200, causing noise that can potentially cause a data error. For example, referring now back to FIG. 1, if sense amplifier 140 is sensing data from memory core 120 in bank 0 while a column decode line addressing sense amplifier 146 is changing, a data error in sense amplifier 140 can result. As memory devices become larger, and more banks are added, the problem becomes worse.

For the reasons stated above, and for other reasons stated below which will become apparent to those skilled in the art upon reading and understanding the present specification, there is a need in the art for alternate multi-bank memory devices.

DETAILED DESCRIPTION OF THE INVENTION

Figure 1:
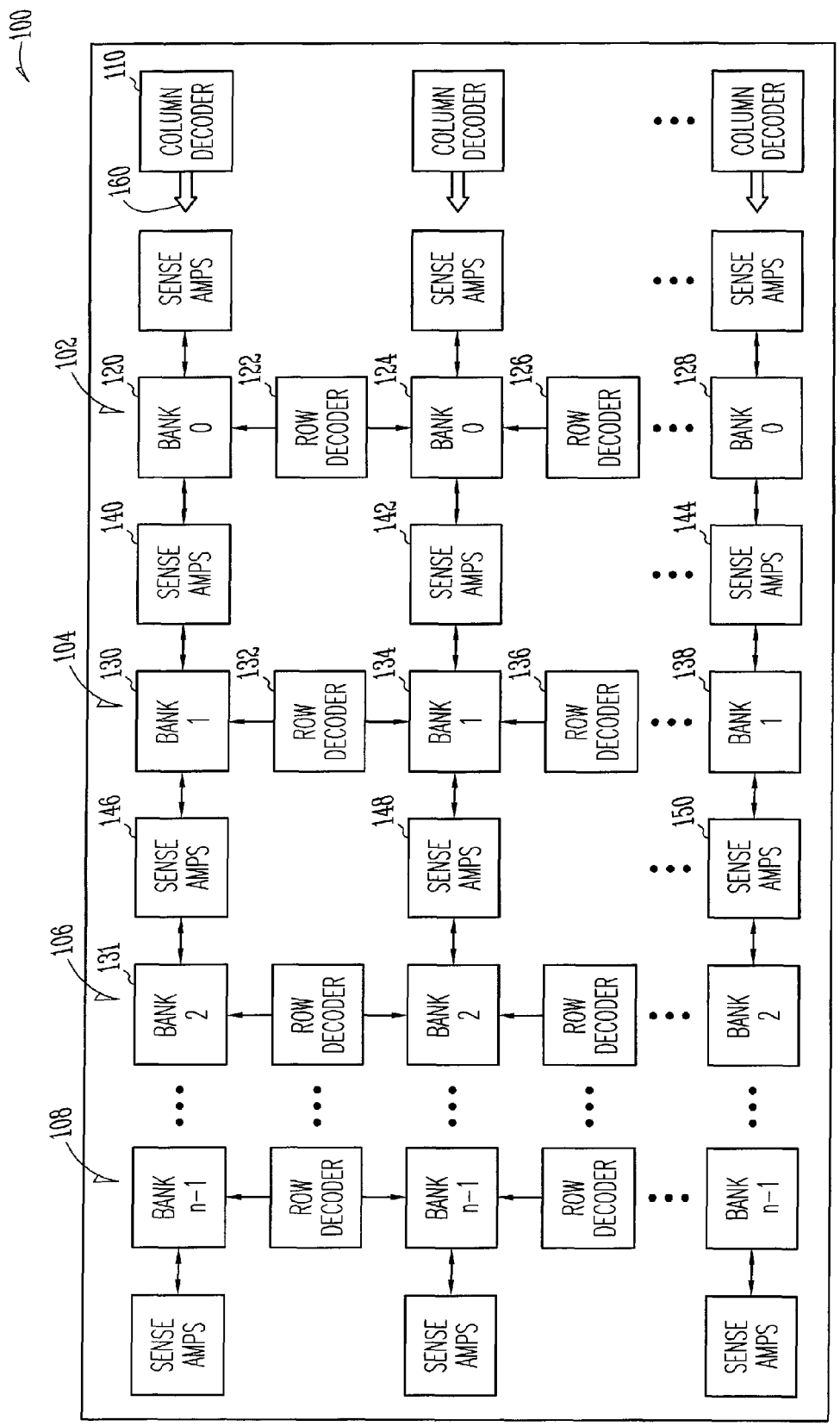
FIG. 1 is a diagram of a prior art multi-bank memory device.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 3:
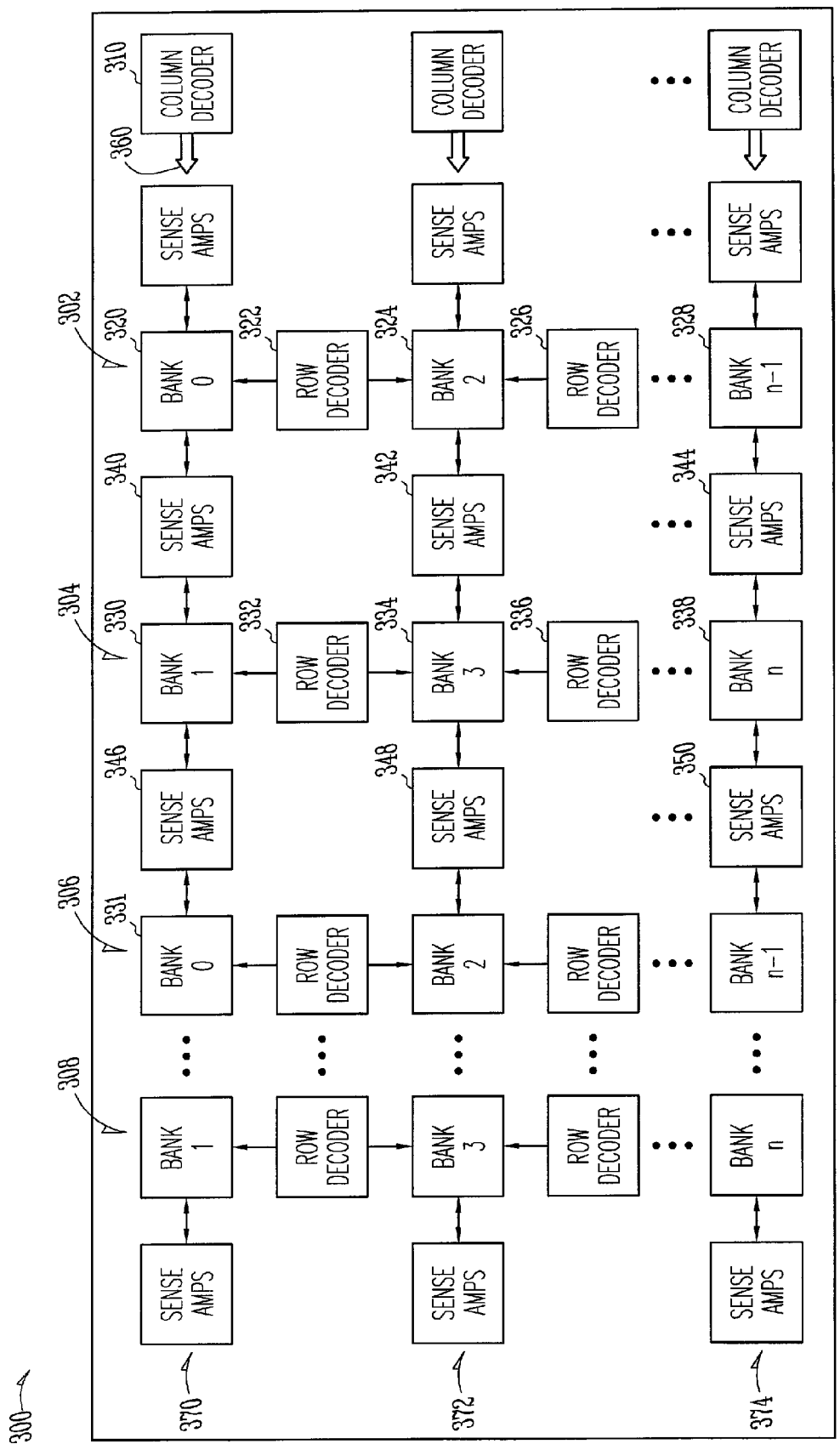
FIG. 3 is a diagram of a multi-bank memory device of the present invention.

FIG. 3 shows a multi-bank memory device in accordance with the present invention. Memory device 300 includes memory cells arranged in rows and columns. Each column is shown as a vertical strip of memory cells, and each row is shown as a horizontal strip of memory cells. For example, strip 302 is a column that includes memory cells 320, 324, and 328 (and similarly strips 304, 306 and 308 include memory cells such as 331, 334 and 338), and strip 370 is a row that includes memory cells 320 and 330. As shown in FIG. 1, memory device 100 is arranged into "n" banks labeled Bank 0 through Bank (n-1).

Each row in memory device 300 includes memory cores from two banks interleaved together. For example, strip 370 includes memory cores from Bank 0 and Bank 1 alternating across the strip. Also for example, strip 372 includes memory cores from Bank 2 interleaved with memory cores from Bank 3.

Each row includes sense amplifiers that are shared between two banks of memory cores. For example, sense amplifiers 340 and 346 are shared between memory cores in Bank 0 and memory cores in Bank 1, and sense amplifiers 342 and 348 are shared between memory cores in Bank 2 and memory cores in Bank 3.

Local row decoders are arranged within the array of memory cores. Each local row decoder provides wordline addressing to memory cores in close proximity. For example, in FIG. 3, each of row decoders 322 and 326 provide row decoding for one or more of the memory cores in strip 302, while row decoders 332 and 336 provide similarly for strip 304. In some embodiments, row decoders are shared among multiple memory cores, with latches and row drivers dedicated to each bank. For example, in the embodiment of FIG. 3, row decoders can be shared between Bank 0 and Bank 2. In operation, each of these row decoders performs a row decode operation, and the result is steered into a latch for Bank 0 or a latch for Bank 2.

Column decode lines driven by column decoders typically traverse an entire row of memory cores, rather than only memory cores nearby. For example, column decoder 310 drives column decode lines 360 shown schematically in FIG. 3 as an arrow. One or more of column decode lines 360 traverse multiple memory cells of the row to enable sense amplifiers within the row across from the column decoder. For example, a column decode line that enables sense amplifiers 346 to read from memory core 331 in Bank 0 will typically travel over, under, or past memory cores 320 and 330 from Banks 0 and 1, respectively. In similar fashion, sense amplifiers 344 and 350 may read from memory cores in Banks n or n-1.

Multi-bank memory device 300 is useful in part because each row includes memory cores from banks that cannot be simultaneously accessed. For example, memory cores from Bank 0 and Bank 1 are interleaved in a single row. Because memory cores from Bank 0 and Bank 1 share sense amplifiers, they cannot be simultaneously accessed. Banks in other rows, however, may be accessed at the same time or overlapping in time with an access of memory cores in Bank 0 or Bank 1. Each row has at least one column decoder dedicated thereto. For example, row 370 has column decoder 310 dedicated thereto. Because each row supports only one access at a time, column decode lines driven by each column decoder change only during an access to that particular row, and the noise problem associated with memory device 100 (FIG. 1) is avoided.

Multi-bank memory device 300 is arranged as a two dimensional array of memory cores. One dimension of the array includes strips of memory cores, each strip having interleaved memory cores from two separate banks. The other dimension of the array contains strips that do not include memory cores from common banks. In the embodiment shown in FIG. 3, each strip that includes interleaved memory cores from two banks is situated in a row, and strips that do not include memory cores from common banks are situated in columns. In other embodiments, columns include interleaved memory cores rather than rows.

Figure 4:
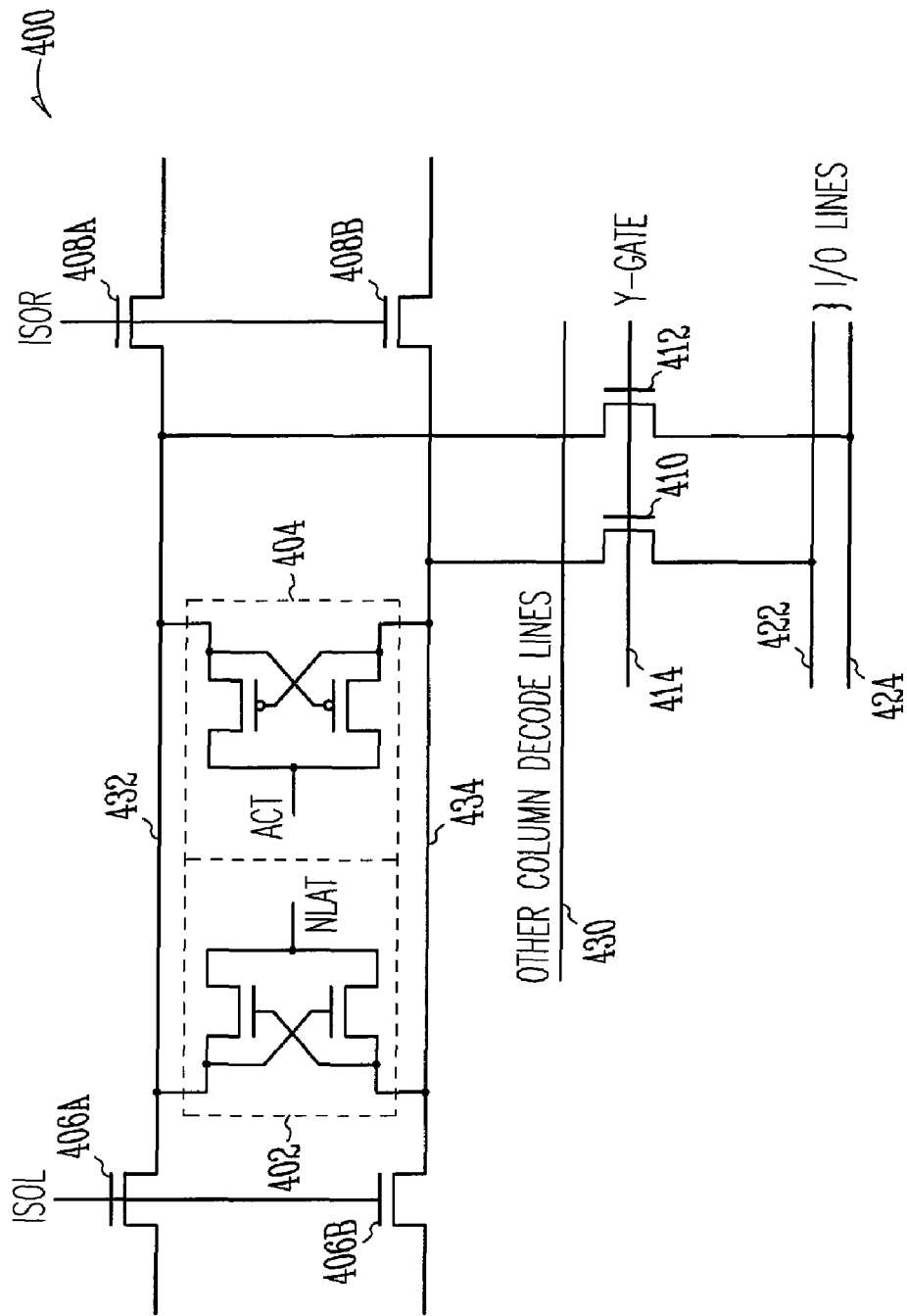
FIG. 4 is a diagram of a sense amplifier in accordance with the present invention.

FIG. 4 shows a sense amplifier in accordance with the present invention. Sense amplifier 400 includes N-sense amplifier 402 and P-sense amplifier 404 coupled between sense nodes 432 and 434, isolation transistors 406A, 406B, 408A, and 408B, and column decode transistors 410 and 412. Sense nodes 432 and 434 are coupled to input output (I/O) lines 424 and 422 through the column decode transistors. A column decode signal (Y-GATE) on node 414 is coupled to column decode transistors 410 and 412.

Other column decode lines 430 driven by the column decoder pass nearby sense amplifier 400. Other column decode lines 430 are coupled to other sense amplifiers (not shown) in the same manner that Y-GATE is coupled to sense amplifier 400 on node 414. Because each row includes interleaved memory cores from two banks, the sense amplifiers in the same row as sense amplifier 400 access memory cores from the same two banks as sense amplifier 400. As a result, other column decode lines 430 are not changing when sense amplifier 400 is sensing.

In operation, when data from a memory core either to the left or right of sense amplifier 400 is to be read, the appropriate isolation transistors are turned on by either signal ISOL or ISOR, and the N-sense and P-sense amplifiers are activated using signals NLAT and ACT, respectively. The data value (and its complement) being read appears on sense nodes 432 and 434. When the column decode signal (Y-GATE) on node 414 is asserted, transistors 410 and 412 turn on and couple sense amplifier 400 to I/O lines 422 and 424.

Figure 2:
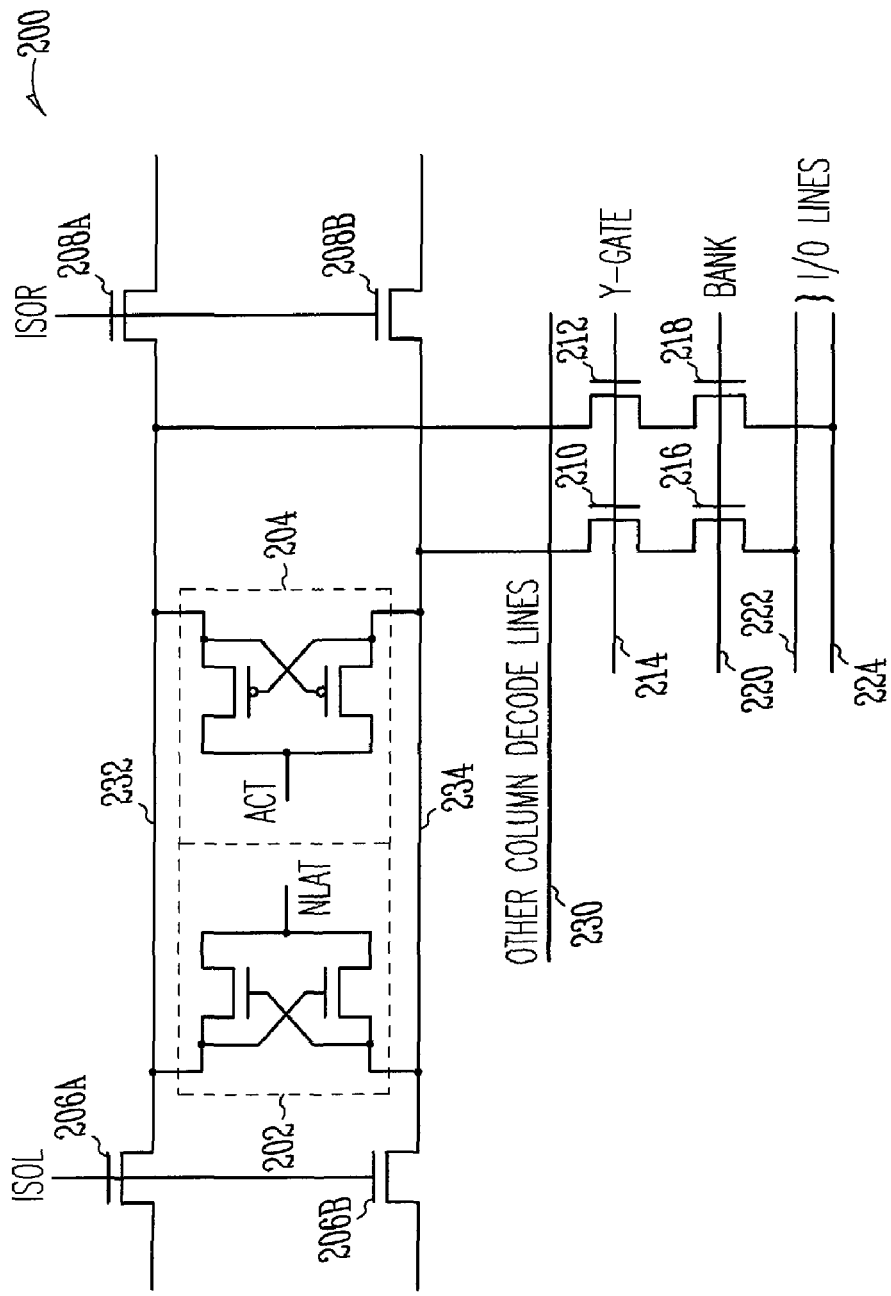
FIG. 2 is a diagram of a prior art sense amplifier.

Sense amplifier 400 does not include bank select transistors such as bank select transistors 216 and 218 (FIG. 2). This is because each row only includes memory cores from two banks that cannot be simultaneously accessed, and there is no need to identify which bank is being accessed with a bank decode signal. As a result, sense amplifier 400 can be made significantly smaller than sense amplifier 200 (FIG. 2).

Node 414 and other column decode lines 430 are conductors that run substantially parallel to a row of memory cores and sense amplifiers. For example, referring now back to FIG. 3, column decode lines 160 run substantially parallel to row 370. The conductors can be made from metal, poly, or any other suitable material. For example, in a two-layer metal process, the column decode lines can be dedicated to a single metal layer. Also for example, in a single layer metal process, the column decode lines can be buried on poly layers.

Figure 5:
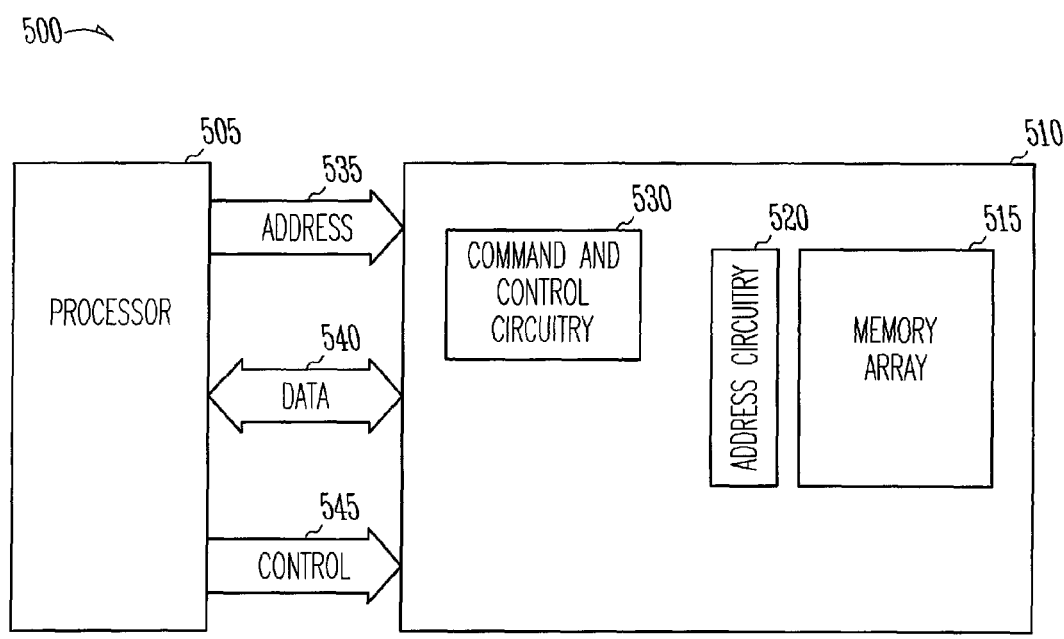
FIG. 5 is a diagram of a processing system in accordance with the present invention.

FIG. 5 is a diagram of a processing system in accordance with the present invention. System 500 includes processor 505 and memory device 510. Memory device 510 includes memory array 515, address circuitry 520, and read circuitry 530, and is coupled to processor 505 by address bus 535, data bus 540, and control bus 545. Memory array 515 includes memory cells and circuits arranged in accordance with those embodiments discussed above with reference to FIGS. 3 and 4.

Memory device 510 is typically mounted on a motherboard. Processor 505, through address bus 535, data bus 540, and control bus 545 communicates with memory device 510. In a read operation initiated by processor 505, address information, data information, and control information are provided to memory device 510 through busses 535, 540, and 545. This information is decoded by addressing circuitry 520 and read circuitry 530. Successful completion of the read operation results in information from memory array 515 being communicated to processor 505 over data bus 540.

CONCLUSION

A multi-bank memory device has been described that includes rows and columns of memory cores. Each row includes memory cores from one bank interleaved with memory cores from another bank. Banks in different rows can be simultaneously accessed without noise coupling from one access to the other.

In one embodiment, a memory device includes a plurality of banks, each including a plurality of memory cores, and also includes a plurality of sense amplifiers shared among memory cores of different ones of the plurality of banks. The memory cores from two of the different ones of the plurality of banks are interleaved in a strip with the plurality of shared sense amplifiers.

In another embodiment, an integrated circuit includes an array of memory cores having a first dimension and a second dimension, where a strip of memory cores in the first dimension includes memory cores from a first bank interleaved with memory cores from a second bank. In this embodiment, a plurality of sense amplifiers are arranged between memory cores from the first bank and memory cores from the second bank.

In another embodiment, a computer system includes a processor and a memory device coupled to the processor. The memory device includes a plurality of rows and columns of memory cores, and also includes a plurality of sense amplifiers positioned between memory cores within each row, wherein every other memory core within each row is assigned to a bank.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   a first strip of memory core blocks including a first plurality of memory core blocks from a first memory bank repetitively interleaved with a second plurality of memory core blocks from a second memory bank; and
   a plurality of sense amplifiers located in the first strip of memory core blocks, wherein each of the plurality of sense amplifiers is coupled between one of the first plurality of memory core blocks from the first memory bank and one of the second plurality of memory core blocks from the second memory bank, the first strip including only memory core blocks from the first memory bank and the second memory bank.

2. The memory device of claim 1, wherein the first plurality of memory core blocks from the first memory bank are all connected to be activated by a single signal.

3. The memory device of claim 2, wherein the memory device further includes a plurality of strips of memory core blocks disposed in parallel and having a first one memory core block of each strip of the plurality of strips of memory core blocks disposed adjacent to at least another first one memory core block of another one of the plurality of strips of memory core blocks.

4. The memory device of claim 3, wherein the first one memory core block of each strip of the plurality of strips of memory core blocks is connected to at least one other adjacent first one memory core block of the plurality of memory core blocks by a row decoder.

5. The memory device of claim 4, wherein a second strip of memory core blocks includes a third plurality of memory core blocks from a third memory bank interleaved with a fourth plurality of memory core blocks from a fourth memory bank, and at least one sense amplifier is located in the second strip of memory core blocks having a first input connected to one of the third plurality of memory core blocks from the third memory bank and a second input connected to one of the fourth plurality of memory core blocks from the fourth memory bank.

6. The memory device of claim 5, wherein each one of the at least one sense amplifiers are connected to two individual ones of the plurality of strips of memory core blocks, each memory core block belonging to a different memory bank.

7. The memory device of claim 4, wherein all of the row decoders are connected to two individual ones of the plurality of strips of memory core blocks, each memory core block belonging to a different memory bank.

8. The memory device of claim 7, wherein at least one of the row decoders comprise an N-sense amplifier, a P-sense amplifier, a sense node, an anti-sense node, four isolation transistors, two input/output lines, two column decode transistors.

9. A direct dynamic random access memory; comprising:
   a first bank of memory cores disposed in a first linear strip selectable for activation and deactivation as a first group;
   a second bank of memory cores repetitively interleaved with the first bank of memory cores in the first linear strip, the second bank of memory cores selectable for activation and deactivation as a second group independent from the first group, the first linear strip including only memory cores from the first bank and the second bank;
   a plurality of sense amplifiers disposed between the memory cores of the first bank and memory cores of the second bank; and
   a column decoder disposed to activate and deactivate the plurality of sense amplifiers.

10. The direct dynamic random access memory of claim 9, wherein the memory further includes a plurality of linear strips of memory cores disposed in parallel with a first memory core of each linear strip disposed adjacent to at least one other first one memory core of another one of the plurality of linear strips.

11. The direct dynamic random access memory of claim 10, wherein a first memory core of each strip of the plurality of linear strips of memory cores is connected to at least one other adjacent first memory core of the plurality of linear strips of memory cores by a row decoder.

12. The direct dynamic random access memory of claim 10, wherein a second strip of memory cores includes a third plurality of memory cores from a third memory bank interleaved with a fourth plurality of memory cores from a fourth memory bank, and a sense amplifier located in the second strip of memory cores having a first input connected to one of the third plurality of memory cores from the third memory bank and a second input connected to one of the fourth plurality of memory cores from the fourth memory bank.

13. The direct dynamic random access memory of claim 11, wherein each sense amplifier and each row decoder are connected to two memory cores from a different memory bank.

14. The direct dynamic random access memory of claim 13, wherein at least one of the row decoders have two column decode transistors.

15. A method of operating a memory, comprising:
   selecting a plurality of memory core blocks grouped in a plurality of memory banks, each memory bank containing memory core blocks selected for activation or deactivation together by a single selection signal;
   accessing the memory core blocks in a first plurality of strips, a first one of the first plurality of strips including only memory core blocks from a first memory bank and memory core blocks from a second memory bank repetitively interleaved in a first one of the first plurality of strips in an alternating fashion to provide simultaneous access to two different ones of the plurality of memory banks;
   arranging a first memory core block of each one of the first plurality of strips vertically adjacent to a first memory core block of at least one other one of the first plurality of strips to form a second plurality of strips, the second plurality of strips being perpendicular to the first plurality of strips; and
   sensing a state of a memory core block with a plurality of sense amplifiers shared between different ones of the first and second memory banks and interleaved, in at least the first one of the first plurality of strips.

16. The method of claim 15, further including accessing the memory core blocks in a first one of the second plurality of strips formed of the first memory core block of each individual one of the first plurality of strips with column decode conductors.

17. The method of claim 16, further including providing a plurality of sense nodes substantially parallel to the column decode conductors to enable sensing the state of a selected one of the plurality of memory core blocks.

18. The method of claim 16, further including accessing the memory core blocks with a row decoder coupled between two selected memory core blocks of each one of the second plurality of strips, with the row decoder between memory core blocks from different ones of the plurality of memory banks.

19. A method of operating a multi-banked memory, comprising:
   accessing at least one selected one of a plurality of memory banks prior to at least one of a read and a write operation;
   selecting a memory location in a selected one of the plurality of memory banks by asserting a column decode signal;
   selecting, by the column decode signal, a sense amplifier activating one memory location from each of two different ones of the plurality of memory banks, wherein each of the two different ones of the plurality of memory banks includes only two adjacent memory banks that are repetitively interleaved; and
   accessing a selected one of a plurality of rows formed by the plurality of memory banks by selecting one of a plurality of row decoders connected between the plurality of rows with at least one connection of the row decoder connected to a first one of the plurality of memory banks and at least a second connection of the row decoder connect to a second one of the plurality of memory banks.

20. The method of claim 19, wherein the accessing of at least one selected one of the plurality of memory banks includes simultaneously accessing two different memory banks.

21. The method of claim 19, wherein the accessing of at least one selected one of the plurality of memory banks includes non-simultaneous overlapping activation of at least two different ones of the plurality of memory banks.

22. The method of claim 19, wherein asserting the column decode signal does not include asserting a memory bank select signal.

23. The method of claim 19, wherein each one of the plurality of rows formed by the plurality of memory banks comprises alternating at least one memory location from at least two different ones of the plurality of memory banks.

24. The method of claim 23, wherein each one of the alternating at least one memory location shares a sense amplifier.

25. The method of claim 23, wherein each one of the alternating at least one memory location in the plurality of rows is separated from another one of the plurality of rows by one of the plurality of row decoders, and each one of the alternating memory locations is connected by the row decoder to a memory location from a different one of the plurality of memory banks.

* * * * *